United States Patent
Brigham

(10) Patent No.: US 10,249,943 B2
(45) Date of Patent: Apr. 2, 2019

(54) PRINTED CIRCUIT BOARD ASSEMBLY WITH FOAM DIELECTRIC MATERIAL

(71) Applicant: Massachusetts Institute Of Technology, Cambridge, MA (US)

(72) Inventor: Glenn A. Brigham, Chelmsford, MA (US)

(73) Assignee: Massachusetts Institute Of Technology, Cambridge, MA (US)

( * ) Notice: Subject to any disclaimer, the term of this patent is extended or adjusted under 35 U.S.C. 154(b) by 0 days.

(21) Appl. No.: 15/302,638

(22) PCT Filed: Apr. 9, 2015

(86) PCT No.: PCT/US2015/025114
§ 371 (c)(1),
(2) Date: Oct. 7, 2016

(87) PCT Pub. No.: WO2015/195186
PCT Pub. Date: Dec. 23, 2015

(65) Prior Publication Data
US 2017/0040678 A1    Feb. 9, 2017

Related U.S. Application Data

(60) Provisional application No. 62/013,594, filed on Jun. 18, 2014.

(51) Int. Cl.
*H05K 1/03* (2006.01)
*H05K 3/00* (2006.01)
(Continued)

(52) U.S. Cl.
CPC ............... *H01Q 1/38* (2013.01); *H01Q 1/48* (2013.01); *H01Q 9/0421* (2013.01);
(Continued)

(58) Field of Classification Search
CPC ........ H05K 1/03; H05K 1/036; H05K 1/0313; H05K 1/032; H05K 1/0326; H05K 1/033; H05K 1/034; H05K 1/0346; H05K 3/0047

See application file for complete search history.

(56) References Cited

U.S. PATENT DOCUMENTS 4,959,658 A    9/1990  Collins
5,117,240 A    5/1992  Anderson et al.
(Continued)

OTHER PUBLICATIONS

IEEE 2005 Electronic Components and Technology Conference, 2005, pp. 1378-1382, "A New Via Hole Structure of MLB (Multi-Layered Printed Circuit Board) for RF and High Speed Systems", Kim, et al.
(Continued)

*Primary Examiner* — Jeremy C Norris
(74) *Attorney, Agent, or Firm* — Nields, Lemack & Frame, LLC

(57) ABSTRACT

An assembly that includes a printed circuit board and a foam dielectric material, and a method of fabricating the assembly is disclosed. The assembly includes at least one layer of a foam dielectric material, which has properties similar to those of air. This layer of foam dielectric material is disposed between a top sublaminate and a bottom sublaminate. The bottom sublaminate may be a traditional printed circuit board, comprising an arbitrary number of layers. The top sublaminate may be a single layer, or may be multiple layers and may include an antenna. The foam dielectric material serves to provide mechanical support for the top sublaminate and the central conductor. The foam dielectric material also provides physical separation between the bottom sublaminate and the antenna.

24 Claims, 9 Drawing Sheets

(51) Int. Cl.
*H01Q 1/38* (2006.01)
*H01Q 9/04* (2006.01)
*H01Q 9/28* (2006.01)
*H01Q 1/48* (2006.01)
H05K 1/02 (2006.01)
H05K 1/16 (2006.01)

(52) U.S. Cl.
CPC ............ *H01Q 9/285* (2013.01); *H05K 1/024* (2013.01); *H05K 1/0222* (2013.01); *H05K 1/165* (2013.01); *H05K 2201/0116* (2013.01); *H05K 2201/0187* (2013.01); *H05K 2201/10098* (2013.01); *H05K 2203/061* (2013.01)

(56) References Cited

U.S. PATENT DOCUMENTS

| | | |
|---|---|---|
| 5,949,030 A | 9/1999 | Fasano et al. |
| 7,404,250 B2 | 7/2008 | Cheng et al. |
| 8,502,085 B2 | 8/2013 | Kim |
| 9,635,761 B2 | 4/2017 | Brigham et al. |
| 2004/0246191 A1 | 12/2004 | Melconian et al. |
| 2005/0247482 A1 | 11/2005 | Nakamura |
| 2006/0044083 A1 | 3/2006 | Kuzmenka |
| 2006/0256024 A1* | 11/2006 | Collinson ................ H01Q 5/00 343/770 |
| 2007/0124930 A1 | 6/2007 | Cheng et al. |
| 2007/0194431 A1 | 8/2007 | Corisis et al. |
| 2009/0066598 A1 | 3/2009 | Malstrom et al. |
| 2009/0294167 A1 | 12/2009 | Nomiya |
| 2009/0322636 A1 | 12/2009 | Brigham et al. |
| 2010/0195301 A1 | 8/2010 | Fotherby |
| 2011/0203842 A1 | 8/2011 | Russell |
| 2012/0012375 A1 | 1/2012 | Song |
| 2012/0175782 A1 | 7/2012 | Im et al. |
| 2013/0088406 A1 | 4/2013 | Hamada et al. |
| 2013/0105987 A1* | 5/2013 | Gallegos .............. H05K 1/0222 257/774 |
| 2013/0318847 A1 | 12/2013 | Kelly |
| 2015/0014045 A1 | 1/2015 | Brigham et al. |
| 2015/0276459 A1 | 10/2015 | Sai et al. |
| 2017/0208695 A1 | 7/2017 | Brigham et al. |
| 2018/0048061 A1 | 2/2018 | Brigham |

OTHER PUBLICATIONS

IEEE Transactions on Components and Packaging Technologies, vol. 26, No. 2, Jun. 2003, pp. 483-489, "Characterization and Modeling of a New Via Structure in Multilayered Printed Circuit Boards", Kwon, et al.

Proceedings of the 37th European Microwave Conference, Oct. 2007, Munich, Germany, pp. 134-137, "Design and Optimization of Coax-to-Microstrip Transition and Through-Hole Signal Via on Multilayer Printed Circuit Boards", Nath, et al.

IEEE Transactions on Microwave Theory and Techniques, vol. 45, No. 10, Oct. 1997, pp. 1981-1985, "Coax Via—A Technique to Reduce Crosstalk and Enhance Impedance Match at Vias in High-Frequency Multilayer Packages Verified by FDTD and MoM Modeling", Pillai.

International Search Report and Written Opinion dated Dec. 16, 2014 in co-pending PCT application No. PCT/US14/46211.

International Search Report and Written Opinion dated Aug. 12, 2015 in corresponding PCT application No. PCT/US2015/025114.

International Preliminary Report on Patentability dated Dec. 20, 2016 in corresponding PCT application No. PCT/US2015/025114.

Office action dated Jun. 27, 2018 in co-pending U.S. Appl. No. 15/459,383.

International Search Report and Written Opinion dated Jan. 17, 2018 in co-pending PCT application No. PCT/US17/41837.

Final rejection dated Dec. 26, 2018 in co-pending U.S. Appl. No. 15/459,383.

* cited by examiner

PRINTED CIRCUIT BOARD ASSEMBLY WITH FOAM DIELECTRIC MATERIAL

This application claims priority to U.S. Provisional Application Ser. No. 62/013,594, filed Jun. 18, 2014, the disclosure of which is incorporated herein by reference in its entirety.

This invention was made with U.S. Government support under Contract No. FA8721-05-C-0002, awarded by the U.S. Air Force. The Government has certain rights in the invention.

BACKGROUND

Printed circuit boards are used ubiquitously for a wide range of applications. A typical printed circuit board (or PCB) has a top and bottom surface, on which components may be affixed, such as by soldering. Between the top and bottom surfaces are a plurality of layers used to carry signals from one point on the PCB to another point. Each layer is comprised of an insulating material with conductive material disposed thereon.

Signals that begin on one layer can move to another layer through the use of vias. Vias are conductive pathways that connect signals on various layers together. If the layers of the PCB are defined as being horizontal planes, these vias are typically vertical conductive pathways. In some embodiments, the vias pass through the entirety of the PCB. In other embodiments, known as blind vias, the via is accessible on either the top or bottom surface, but does not pass through the entirety of the PCB. In another embodiment, known as buried vias, the via may connect signals on two interior layers and not be accessible on either outer surface.

In some embodiments, it may be beneficial to incorporate an antenna into the printed circuit board. However, the insulating material typically used for PCBs has very different properties than air. Most antennas are calibrated and tested with respect to air. Furthermore, higher efficiency and greater antenna operating performance may be achieved if the antenna is spaced apart from the PCB by a layer of air, rather than a different material. Therefore, it may be difficult to develop an antenna that is incorporated into a PCB that has the desired characteristics.

Therefore, it may be desirable for the antenna to be spaced apart from the PCB. However, such a configuration presents challenges regarding mechanically supporting the antenna, and providing electrical connections to the antenna. Therefore, it would be beneficial if there were a process to create a PCB with an attached antenna, where the antenna is spaced apart from the PCB itself. Further, it would be desirable if the antenna was mechanically supported by the PCB and had robust electrical connections thereto. For example, it would be beneficial if a foam dielectric layer could be used to separate the antenna from the PCB, where electrical connections were made through the foam dielectric layer.

SUMMARY

An assembly that includes a printed circuit board and a foam dielectric material, and a method of fabricating the assembly is disclosed. The assembly includes at least one layer of a foam dielectric material, which has properties similar to those of air. This layer of foam dielectric material is disposed between a top sublaminate and a bottom sublaminate. The bottom sublaminate may be a traditional printed circuit board, comprising an arbitrary number of layers. The top sublaminate may be a single layer, or may be multiple layers and may include an antenna. The foam dielectric material serves to provide mechanical support for the top sublaminate and the central conductor. The foam dielectric material also provides physical separation between the bottom sublaminate and the antenna.

In one embodiment, an assembly is disclosed. The assembly comprises a top sublaminate; a bottom sublaminate; a foam dielectric material disposed between the top sublaminate and the bottom sublaminate; and a via passing through the foam dielectric material, so as to electrically connect a first signal trace on the top sublaminate to a second signal trace on the bottom sublaminate. In certain embodiments, the via comprises an annular metal sleeve disposed around an inner circumference of the via; a conductive path disposed within the annular metal sleeve connecting the first signal trace on the top sublaminate to the second signal trace disposed on the bottom sublaminate; and an insulating material disposed in the via between the annular metal sleeve and the conductive path.

In another embodiment, a method of manufacturing an assembly is disclosed. The method comprises processing a top sublaminate, having a first signal trace; processing a bottom sublaminate, having a second signal trace; cleaning and baking a foam dielectric material; drilling a first hole through the foam dielectric material; filling the first hole with a dielectric material, different than the foam dielectric material; bonding the top sublaminate to a first surface of the foam dielectric material and the bottom sublaminate to a second surface of the foam dielectric material; drilling a second hole through the top sublaminate, the dielectric material in the foam dielectric material and the bottom sublaminate; and plating and filling the second hole to create a central conductor to electrically connect the first signal trace and the second signal trace.

In another embodiment, a method of manufacturing an assembly having a coaxial sleeve is disclosed. The method comprises processing a top sublaminate, having a first signal trace; processing a bottom sublaminate, having a second signal trace; cleaning and baking a foam dielectric material; drilling a first hole through the foam dielectric material; filling and planarizing the first hole with a dielectric material, different than the foam dielectric material; bonding the top sublaminate to a first surface of the foam dielectric material; drilling a second hole through the dielectric material and the top sublaminate; bonding the bottom sublaminate to a second surface of the foam dielectric material; plating the second hole and then filling the plated second hole with dielectric material to create the coaxial sleeve; drilling a third hole through the top sublaminate, the dielectric material in the foam dielectric material and the bottom sublaminate; and plating and filling the third hole to create a central conductor to electrically connect the first signal trace and the second signal trace.

BRIEF DESCRIPTION OF THE DRAWINGS

For a better understanding of the present disclosure, reference is made to the accompanying drawings, which are incorporated herein by reference and in which.

DETAILED DESCRIPTION OF THE INVENTION

While this disclosure relates to the use of foam dielectric materials such as Rohacell®, it is understood that the assemblies and methods described herein may have broader utility and may be used with any dielectric material. Therefore, the disclosure is not limited to a particular embodiment.

Figure 1:
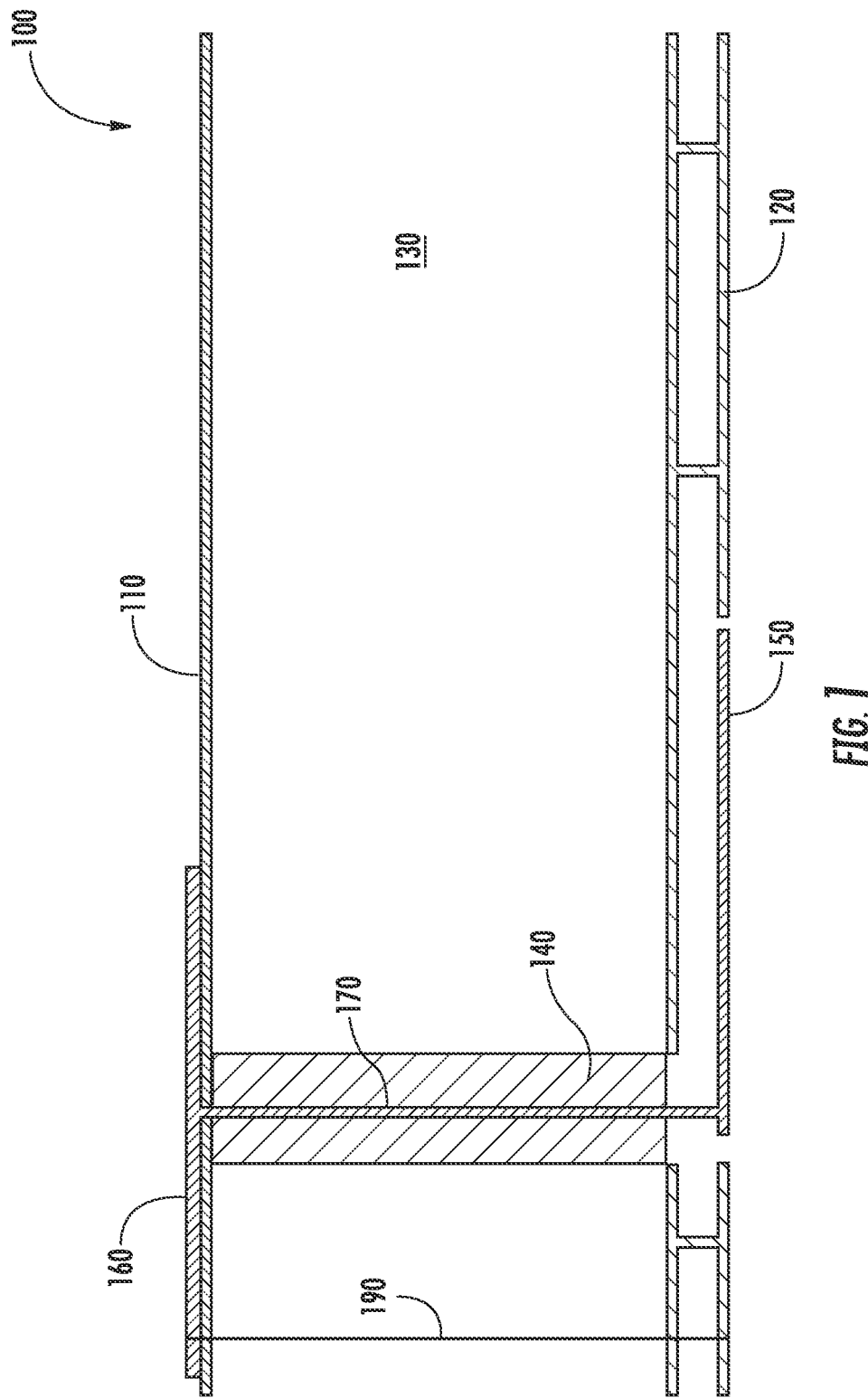
FIG. 1 shows a cross-sectional view of a first embodiment.

FIG. 1 shows a cross-sectional view of an assembly according to a first embodiment. In this embodiment, the assembly 100 includes a top sublaminate 110, a bottom sublaminate 120 and a layer of foam dielectric material 130 disposed therebetween.

The top sublaminate 110 may be a single layer with or without a dielectric material, such as FR4 or RO4350. On the top surface of the top sublaminate 110, an antenna 160 may be created. The antenna 160 may be a metal conductive layer that can be in any desired shape or thickness. The antenna may be planar, meaning that it is disposed on top layer of the top sublaminate 110. In other embodiments, the antenna may not be planar. For example, the antenna may be formed on the top surface of the top sublaminate 110 and have a vertical component. Thus, in certain embodiments, the antenna may have substantially a two dimensional shape, where it is planar on the surface of the top sublaminate 110. In other embodiments, the antenna 160 may have a three dimensional structure, such that it extends vertically from the top surface of the top sublaminate 110. In other embodiments, a signal trace may be disposed on the top surface of the top sublaminate 110. This signal trace may be a test point or serve some other function.

Thus, the top sublaminate 110 in all of the embodiments described herein may include a dielectric layer with a conductive film or layer disposed on the top surface. In some embodiments, the conductive film or layer comprises a metal layer, such as copper. In certain embodiments, the top sublaminate 110 comprises only a conductive layer, such as a metal sheet, that is either bonded directly to, or deposited on, the layer of foam dielectric material 130.

The bottom sublaminate 120 may be a printed circuit board, fabricated using traditional techniques. The bottom sublaminate 120 may have an arbitrary number of signal, power and ground layers, as the present disclosure does not limit the type or complexity of the bottom sublaminate 120. The bottom sublaminate 120 may comprises a plurality of distinct layers stacked on top of one another, such as a top surface (which faces the foam dielectric material), zero or more interior layers and a bottom surface. These various layers may have different functions. For example, some layers may be signal layers. Conductive traces are disposed on signal layers to route signals across the bottom sublaminate 120. Some layers may be ground layers, which as the name suggests, are conductive layers which are electrically connected to ground. Other layers may be power layers, which are conductive layers that are electrically connected to one or more voltage sources. The disclosure is not limited to any particular number of layers in the bottom sublaminate 120. In fact, any number of signal and ground layers may be included in the bottom sublaminate 120. In some embodiments, one or more power layers may also be included in the bottom sublaminate 120. In certain embodiments, the top surface of the bottom sublaminate 120 may be a first signal layer, while the bottom surface may be a second signal layer. Again, any number of layers may be disposed between the top and bottom surfaces. For example, the interior layers may also comprise one or more signal layers. In certain embodiments, one or more of the interior layers may be ground layers.

The various layers of the bottom sublaminate 120 may be separated by different materials. For example, the top surface and an adjacent interior layer may be separated by a laminate material, suitable for high frequency signals. One such material may be RO4350®, available from Rogers Corporation. The thickness of this laminate material may be about 10 mils, although other thicknesses are within the scope of the disclosure. The material used may be designed for RF applications and have a specific dielectric constant and loss tangent. Many materials having suitable performance may be used. In one embodiment, a particular material is used due to its performance, cost and its dielectric constant.

Ground and power layers are typically comprised of copper, such as 0.5 ounce copper. Other copper thicknesses may be used, based on acceptable electrical and mechanical performance. The interior layers may be separated by a dielectric material. In some embodiments, RF signals are not carried on one or more of the interior layers. In these embodiments, the RF signals on the top and bottom surfaces may not be coupled to or influenced by this dielectric material used in the interior layers. In these embodiments, a low cost material, such as FR4, which is commonly used for PCBs, may be used to separate the interior layers. However, other materials may also be used to separate the interior layers. For example, in one embodiment, RO4350® may be used to separate the interior layers as well. This dielectric material may be about 50 mils thick, although other thicknesses are also within the scope of the disclosure.

Many different laminate material types may be used to separate the various layers of the bottom sublaminate 120. In some embodiments, the laminate material may be the same as the dielectric material for material uniformity. However, in other embodiments, different materials may be used, based on the electrical and mechanical performance requirements, cost, and availability. For example, the material used between adjacent layers that do not carry high frequency signals may be lower cost filler materials, as described above.

Thus, the bottom sublaminate 120 may comprise a top surface, a bottom surface, and zero or more interior layers disposed between the top surface and the bottom surface. The bottom sublaminate 120 may comprise any desired number of signal layers, and may also comprise any desired number of ground and power layers. In one particular embodiment, the bottom sublaminate 120 may be a single metal layer deposited or otherwise attached to the foam dielectric material.

The bottom sublaminate 120 also comprises a signal trace 150. While the signal trace 150 is shown on the bottom surface of the bottom sublaminate 120, the disclosure is not limited to this embodiment. In other embodiments, the signal trace 150 may be on the top surface of the bottom sublaminate 120, proximate to the foam dielectric material 130. In yet other embodiments, the signal trace 150 may be on an interior layer of the bottom sublaminate 120. In some embodiments, shorting vias 125 may exist between the ground plane of the bottom sublaminate 120 and the surface that contacts the foam dielectric material 130.

Disposed between the top sublaminate 110 and the bottom sublaminate 120 is a layer of foam dielectric material 130. This foam dielectric material 130 may be selected to have properties, such as a dielectric constant and density, similar to those of air. Examples of this foam dielectric material include Rohacell®, Polymethacrylimide PMI FOAM SkyCell H71, various materials from Airex and ECCOSTOCK® SH. Other materials may also be used. Throughout this disclosure, the term "foam dielectric material" is used to denote a dielectric material which is manufactured as a foam. A foam is a material formed by trapping gas within the solid. This process may be used to create a material having open cells, which is defined as a material having 50% or more of the cells open, or connected to one another. Alternatively, this process may be used to create a material having closed cells, which refers to a material where at least 90% of the cells are discrete pockets of gas. In certain embodiments, the foam dielectric material has more than 50% gas. In certain embodiments, the foam material may have more than 75% gas. In certain embodiments, the foam material may have at least 90% gas. Further, the high ratio of gas to solid also affects other parameters of the foam dielectric material. For example, the density of the material may be less than 0.5 g/cc because of the large amount of gas. In certain embodiments, the density may be less than 0.1 g/cc. Additionally, because of the amount of gas in the foam dielectric material, its dielectric constant may approach that of air. For example, in certain embodiments, the dielectric constant of the foam dielectric material may be less than 2.0. In certain embodiments, the dielectric constant may be less than 1.5. In certain embodiments, the dielectric constant may be less than 1.25. In certain embodiments, the foam dielectric material may have a dielectric constant within 10% of that of air. In addition to the attributes of the foam dielectric material which result from its high gas content, the foam dielectric material may preferably have other properties. For example, the foam dielectric material may be strong enough to support drilling and other PCB processes. Also, the dielectric foam material may preferably have a high thermal temperature so that it can endure processing better, since some of the processes described herein use an elevated temperature.

The thickness of the foam dielectric material 130 may be selected based on the various criteria. For example, in some embodiments, the thickness of the foam dielectric material 130 may be a fixed thickness, such as 250 mil. Of course, other criteria may also be used.

The antenna 160 connects to the signal trace 150 by virtue of a central conductor 170, which passes through the foam dielectric material 130. The central conductor 170 is a conductive material and is electrically and physically connected to the antenna 160 and the signal trace 150. The central conductor 170 may be surrounded with a dielectric material 140, different than foam dielectric material 130. The dielectric material 140 is used to provide a smooth surface on which to plate. As described above, the foam dielectric material 130 may comprises a large amount of gas, and therefore, may also open cells which are difficult to plate to. The dielectric material 140 is used to fill the cells in the drilled region. Any material that performs this function may be used, including Taiyo UVHP-100 or another material.

This configuration allows a signal trace 150 on the bottom sublaminate 120 to be reliably connected to an antenna 160 that is spaced apart from the bottom sublaminate 120. The foam dielectric material 130 serves to space the antenna 160 from the bottom sublaminate 120. In addition, the foam dielectric material 130 provides mechanical support for the antenna 160 and central conductor 170. Further, the foam dielectric material 130 has a dielectric constant similar to air, allowing improved performance and operation of the antenna 160.

Figure 2:
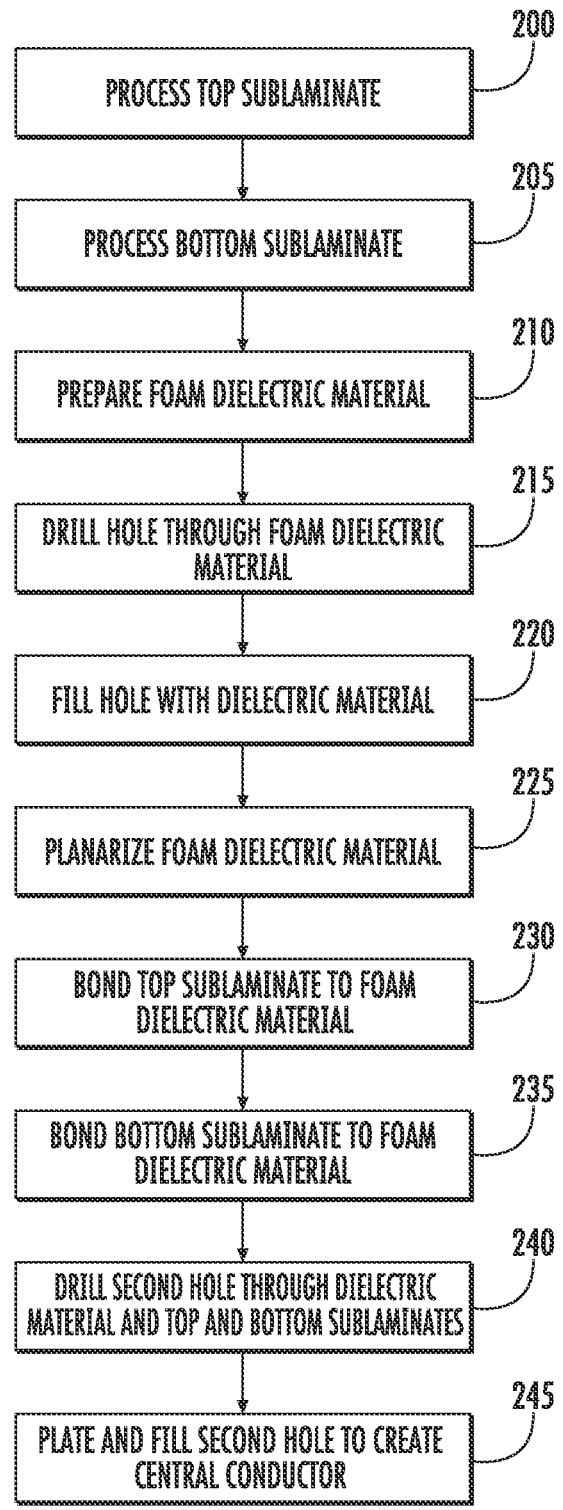
FIG. 2 is a flowchart showing a representative fabrication process used to manufacture the assembly shown in FIG. 1.

FIG. 2 shows a process that may be used to fabricate the assembly 100 shown in FIG. 1.

First, as shown in process 200, the top sublaminate 110 is processed. The top sublaminate 110 may be a single layer having a metal conductor disposed on at least a portion of the top surface of that single layer. The metal conductor, which forms antenna 160, may be any desired pattern. In other embodiments, the top sublaminate 110 may comprise additional layers. As such, the configuration of the top sublaminate 110 is not limited by this disclosure.

Next, as shown in process 205, the bottom sublaminate 120 is processed. The bottom sublaminate 120 may comprise any desired number of layers, where one or more of these layers may be signal layers. Additionally, one or more power and/or ground layers may also be included in the bottom sublaminate 120. In one particular embodiment, the bottom sublaminate 120 may be a single metal layer, which also serves as a ground layer. The bottom sublaminate 120 may be fabricated using traditional manufacturing techniques.

In process 210, the foam dielectric material 130 is prepared. The preparation of the foam dielectric material 130 may comprise a plurality of steps. For example, in some embodiments, the foam dielectric material 130 is first cleaned. The foam dielectric material 130 may then be baked. Exposure to high temperature may cause the foam dielectric material 130 to shrink. After it is cleaned and baked, the foam dielectric material 130 may be planarized to the desired thickness. In other embodiments, the foam dielectric material 130 may be machined to a shape other than flat. Additionally, in some embodiments, alignment holes may also be drilled into the foam dielectric material 130.

After the foam dielectric material 130 has been prepared, a hole is drilled through the foam dielectric material 130, as shown in process 215. This hole is then filled with a dielectric material 140, such as Taiyo UVHP-100 or an equivalent, as shown in process 220. As explained above, the dielectric material 140 is used to fill the open cells in the foam dielectric material 130, thereby providing a smooth surface on which to plate. After the dielectric material 140 has filled the hole, the foam dielectric material 130 may be planarized to insure that the dielectric material 140 is at the correct height, as shown in process 225.

At this point, the top sublaminate 110, the bottom sublaminate 120 and the foam dielectric material 130 have all been processed. The top sublaminate 110 has a conductive pattern for the radiating element, or antenna, on the dielectric layer. The bottom sublaminate 120 has at least one signal trace and a supporting ground plane. It is noted that while FIG. 2 shows the top sublaminate being processed first, this is not a requirement. Indeed, the order in which these three parts are prepared is arbitrary and is not limited by this disclosure.

Each of these three components may include an alignment hole 190. These alignment holes 190 may be aligned during the assembly process to ensure that the components are properly registered.

The top sublaminate 110 is then bonded to the top surface of the foam dielectric material 130, as shown in process 230. The bonding agent may be a pressure sensitive adhesive, a low temperature adhesive or any other suitable agent. In this embodiment, the bonding agent may or may not be conductive. In a preferred embodiment, the bonding agent is not conductive.

The bottom sublaminate 120 is then bonded to the bottom surface of the foam dielectric material 130, as shown in process 235. Like the previous process, the bonding agent may be a pressure sensitive adhesive, a low temperature adhesive or any other suitable agent. The three pieces may be baked under pressure with or without vacuum to cure the bond layers. In some embodiments, the edges of the foam dielectric material 130 may be sealed at this time as well. To seal the edges, a coating may be applied before the baking process. In this embodiment, the bonding agent may or may not be conductive.

After the three parts have been bonded together, a second hole is then drilled through the entire assembly 100, as shown in process 240. This second hole has a smaller diameter than the one drilled in process 215, and is drilled through the dielectric material that was filled in process 220. In some embodiments, the first hole and the second hole are concentric. Thus, the second hole goes through the top sublaminate 110, the foam dielectric material 130 and the bottom sublaminate 120.

The second hole is then plated and filled to create a central conductor 170 through the assembly 100, as shown in process 245. This process also served to bond the antenna 160 to the central conductor 170, and to bond the signal trace 150 to the central conductor 170.

At this point, the assembly 100 is complete and an electrical connection, in the form of central conductor 170, exists between the antenna 160 on the top sublaminate 110 and the signal trace 150 on the bottom sublaminate 120. As noted above, while the signal trace 150 is shown on the bottom layer of the bottom sublaminate 120, it may be disposed on any layer of the bottom sublaminate 120.

If the signal trace 150 is disposed on an interior layer of the bottom sublaminate 120, additional process steps may be required. For example, after process 245, it may be necessary to remove the plating from some layers of the bottom sublaminate 120. For example, assume that the bottom sublaminate has a top surface, a bottom surface and three interior layers, where the signal trace 150 is disposed on the middle of these three interior layers. After the plating is complete, a back drilling process may be performed. In this back drilling process, a hole is drilled in the same location as the central conductor 170. However, this hole is drilled to a controlled depth, such that the plating is removed on the bottom surface and the lower interior layer, but is not removed in the other layers of the bottom sublaminate 120. This back drilling process removes the plating from the layers of the bottom sublaminate 120 that are below the layer on which the signal trace 150 is disposed, but does not affect the upper layers. Note that this process is not necessary if the signal trace 150 is disposed on the bottom layer.

FIG. 1 shows an assembly with a central conductor 170 electrically connecting the antenna 160 with a signal trace 150 through a foam dielectric material 130. In some embodiments, it may be beneficial to route the central conductor 170 using a coaxial sleeved PCB via.

Figure 3:
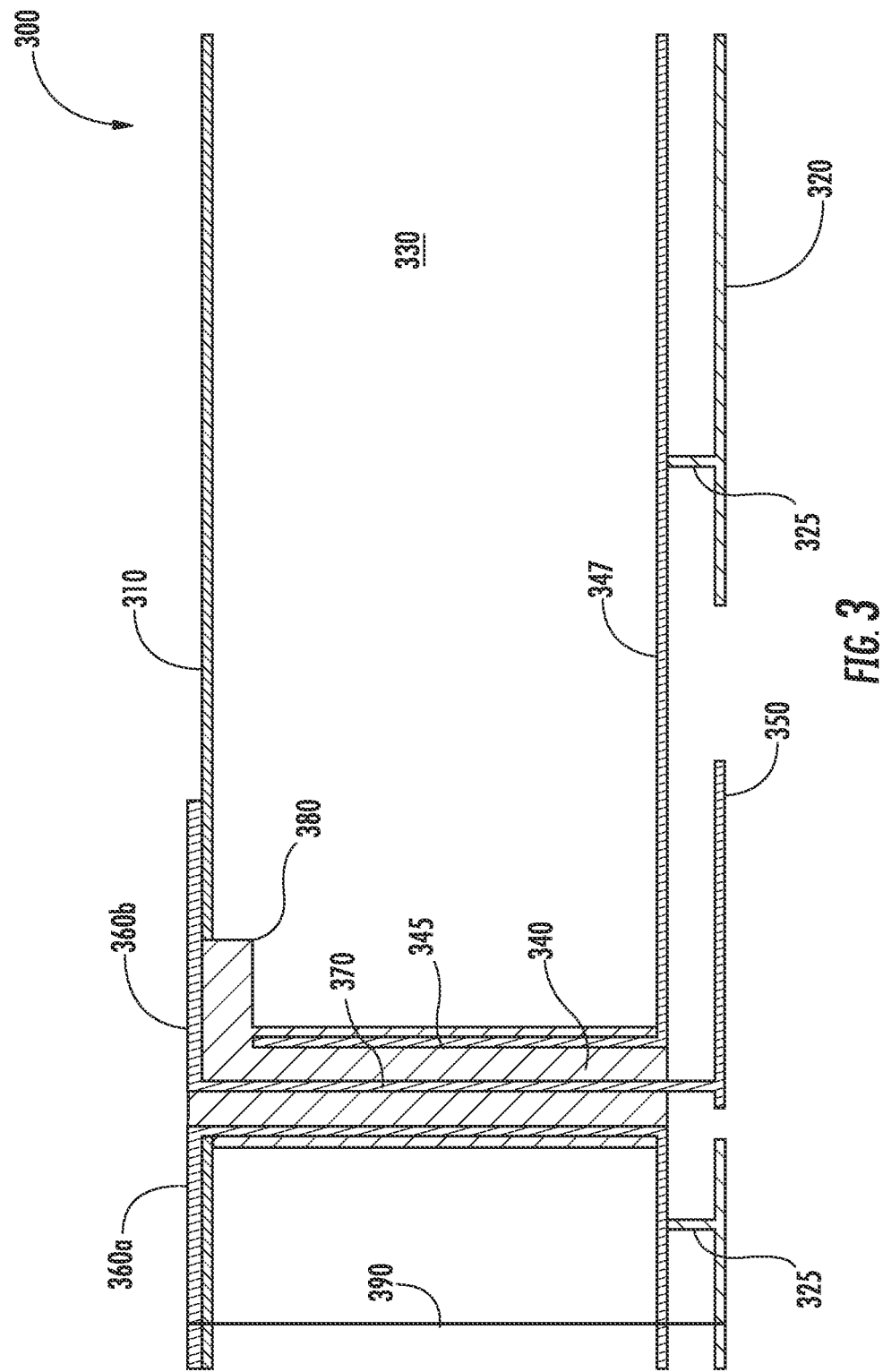
FIG. 3 shows a cross-sectional view of a second embodiment.

FIG. 3 shows an assembly 300 with a top sublaminate 310, a bottom sublaminate 320 and a foam dielectric material 330. This assembly 300 differs from the assembly of FIG. 1 in that the central conductor 370 is now disposed within an annular metal sleeve 345. A dielectric material 340 is disposed between the foam dielectric material 330 and the annular metal sleeve 345 and between the annular metal sleeve 345 and the central conductor 370. This annular metal sleeve 345 is electrically connected on one dipole 360a of antenna 360. The central conductor 370 is electrically connected to the other dipole 360b of the antenna 360. A notch 380 is created in the top sublaminate 310 and the foam dielectric material 330 to allow these two electrical connections. Top sublaminate 310 may be the same configuration and composition as that of top sublaminate 110, described above. Similarly, bottom sublaminate 320 may be the same configuration and composition as that of bottom sublaminate 120, described above. Finally, the foam dielectric material 330 may be the same as foam dielectric material 130, described above.

In this embodiment, the annular metal sleeve 345 may also be electrically connected to a copper foil 347 disposed between the foam dielectric material 330 and the bottom sublaminate 320. The central conductor 370 is electrically connected to a signal trace 350 disposed on the bottom sublaminate 320.

In this embodiment, the foam dielectric material 330 may have a thickness that has been selected through EM modeling for maximum performance by the antenna 360. In some embodiments, the thickness of the foam dielectric material 330 may be about ¼ the resonant wavelength. In other embodiments, the foam dielectric material 330 may be a fixed thickness, such as 250 mil. Of course, the thickness of the foam dielectric material 330 may be determined using other criteria.

Figure 4:
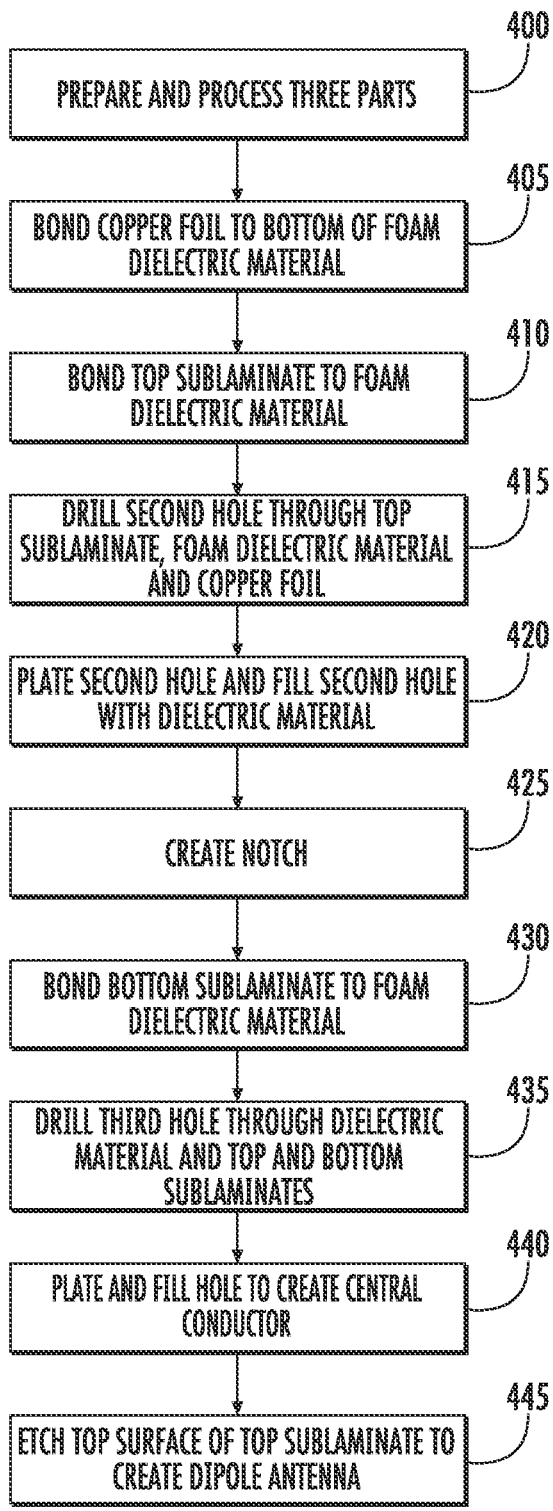
FIG. 4 is a flowchart showing a representative fabrication process used to manufacture the assembly shown in FIG. 3

FIG. 4 shows a first embodiment of a fabrication process to create assembly 300. First, as shown in process 400, the three parts (i.e. the top sublaminate 310, the bottom sublaminate 320 and the foam dielectric material 330) are prepared and processed.

In this embodiment, the top sublaminate 310 may be processed differently than that of FIG. 1. For example, the top sublaminate 310 may comprise a layer of dielectric material with a solid sheet of metal disposed on top of the dielectric layer. Further, in this embodiment, this top surface of the top sublaminate 310 may remain a solid sheet of metal after this first processing step. Final etching of this top surface occurs after the assembly has been completed (see process 445).

The bottom sublaminate 320 may comprise any desired number of layers, where one or more of these layers may be signal layers. Additionally, one or more power and/or ground layers may also be included in the bottom sublaminate 320. The bottom sublaminate 320 may be fabricated using traditional manufacturing techniques.

The preparation of the foam dielectric material 330 may comprise a plurality of steps. For example, in some embodiments, the foam dielectric material 330 is first cleaned. The foam dielectric material 330 may then be baked. Exposure to high temperature may cause the foam dielectric material 330 to shrink. After the foam dielectric material 330 has been prepared, a hole is drilled through the foam dielectric material 330, as was shown in process 215. This hole is then filled with a dielectric material 340, such as Taiyo UVHP-100 or an equivalent, as shown in process 220. As explained above, the dielectric material 340 is used to fill the open cells in the foam dielectric material 130, thereby providing a smooth surface on which to plate. After the dielectric material 340 has filled the hole, the foam dielectric material 330 may be planarized to insure that the dielectric material 340 is at the correct height, as shown in process 225. In other embodiments, the foam dielectric material 330 may be machined to a shape other than flat. Additionally, in some embodiments, alignment holes may also be drilled into the foam dielectric material 330. Alignment holes 390 may be drilled in each of these components to allow registration during the assembly process.

After the three parts are prepared and processed, copper foil 347 is bonded to the bottom of the foam dielectric material 330, as shown in process 405. The bonding agent used to attach the copper foil 347 to the foam dielectric material 330 may be conductive or non-conductive, and may be a pressure sensitive adhesive or a low temperature adhesive. The choice of bonding agent is a design specific implementation and is not limited by this disclosure.

The top sublaminate 310 is then bonded to the top surface of the foam dielectric material 330, as shown in process 410. The bonding agent used may be a pressure sensitive adhesive, a low temperature adhesive or any other suitable agent. The top sublaminate 310 and the foam dielectric material 330 may be baked under pressure with or without vacuum to cure the bond layers. In some embodiments, the edges of the foam dielectric material 330 may be sealed at this time as well. To seal the edges, a coating may be applied before the baking process.

Next, a second hole is drilled completely through the top sublaminate 310, the foam dielectric material 330 and the copper foil 347, as shown in process 415. This second hole is aligned with the dielectric material 340 previously used to fill a hole in the foam dielectric material 330 (see FIG. 2, processes 215, 220 and 225). This second hole has a smaller outer diameter than the first hole drilled through the foam dielectric material 330, and is preferably concentric with that larger diameter hole. As such, there is dielectric material 340 surrounding the second hole.

The second hole is then plated with a metallic material to create an annular metal sleeve 345 connecting the top sublaminate 310 and the copper foil 347, as shown in process 420. The metallic material may be a metal, such as copper. The second hole is then filled with dielectric material 340 again, which is then planarized at the copper foil 347. Thus, at this time, there is an annular metal sleeve 345 running through the top sublaminate 310 and through the thickness of the foam dielectric material 330 to the copper foil 347. Dielectric material 340 is disposed on both sides of this annular metal sleeve 345.

Next, a notch 380 is created, as shown in process 425. The notch 380 is used to remove some of the plating from the portion of the annular metal sleeve 345 near the top sublaminate 310. The notch 380 may be relatively small, and its depth may be set to an optimum depth for maximum antenna performance. The purpose of the notch 380 is to create a path through the annular metal sleeve 345 through which a signal trace can pass on the top surface of the top sublaminate 310. After the notch 380 is created, it is then filled with dielectric material 340. The top surface of the dielectric material on the top sublaminate 310 is then plated, creating a solid metal surface on the top surface of the top sublaminate 310.

Next, as shown in process 430, the bottom sublaminate 320 is bonded to the copper foil 347 that was applied in process 405. The assembly 300 may be baked under pressure with or without vacuum to cure the bottom sublaminate 320 bond layer. The bonding agent may be non-conductive, and may be a pressure sensitive adhesive or a low temperature adhesive. However, in other embodiments, the bonding agent is conductive and is used to electrically connect the copper foil 347 to the bottom sublaminate 320. The top surface of the bottom sublaminate 320 preferably includes one or more shorting vias 325 to electrically connect the copper foil 347 to the ground layers of the bottom sublaminate 320 through the conductive bonding agent. These shorting vias 325 may be added as a final process step through a controlled depth drilling process. In this process, the shorting via 325 is drilled so that its depth just reaches the copper foil 347. The shorting vias are then filled with conductive material to electrically connect the copper foil 247 to a ground plane of the bottom sublaminate 320.

After the assembly 300 has been completed, a third hole is drilled through the entire assembly 300, as shown in process 435. This hole has a smaller outer diameter than the second hole and is preferably concentric with the first and second holes. This hole is then plated and filled to create the central conductor 370, as shown in process 440. At this point, the annular metal sleeve 345 is electrically attached to the copper foil 347, while the central conductor 370 is electrically attached to the signal trace 350 on the bottom sublaminate 320. As described above, if the signal trace 350 is not disposed on the bottom surface of the bottom sublaminate 320, a back drilling process may be used.

However, at this point, the annular metal sleeve 345 and the central conductor 370 are both electrically attached to the metal layer on the top surface of the top sublaminate 310. To separate these two signals, the metal layer on the top surface of the top sublaminate 310 is etched, as shown in process 445. This etching process creates the two dipoles of the antenna, such that the first dipole 360a is in communication with the annular metal sleeve 345 and the second dipole 360b is in electrical communication with the central conductor 370. The first dipole 360a and the second dipole 360b are now separate non-connected features.

While FIG. 4 shows the fabrication sequence being performed in a specific order, it is understood that the steps need not necessarily be performed in this order. Certain steps can be rearranged to also achieve the assembly 300 shown in FIG. 3.

Figure 5:
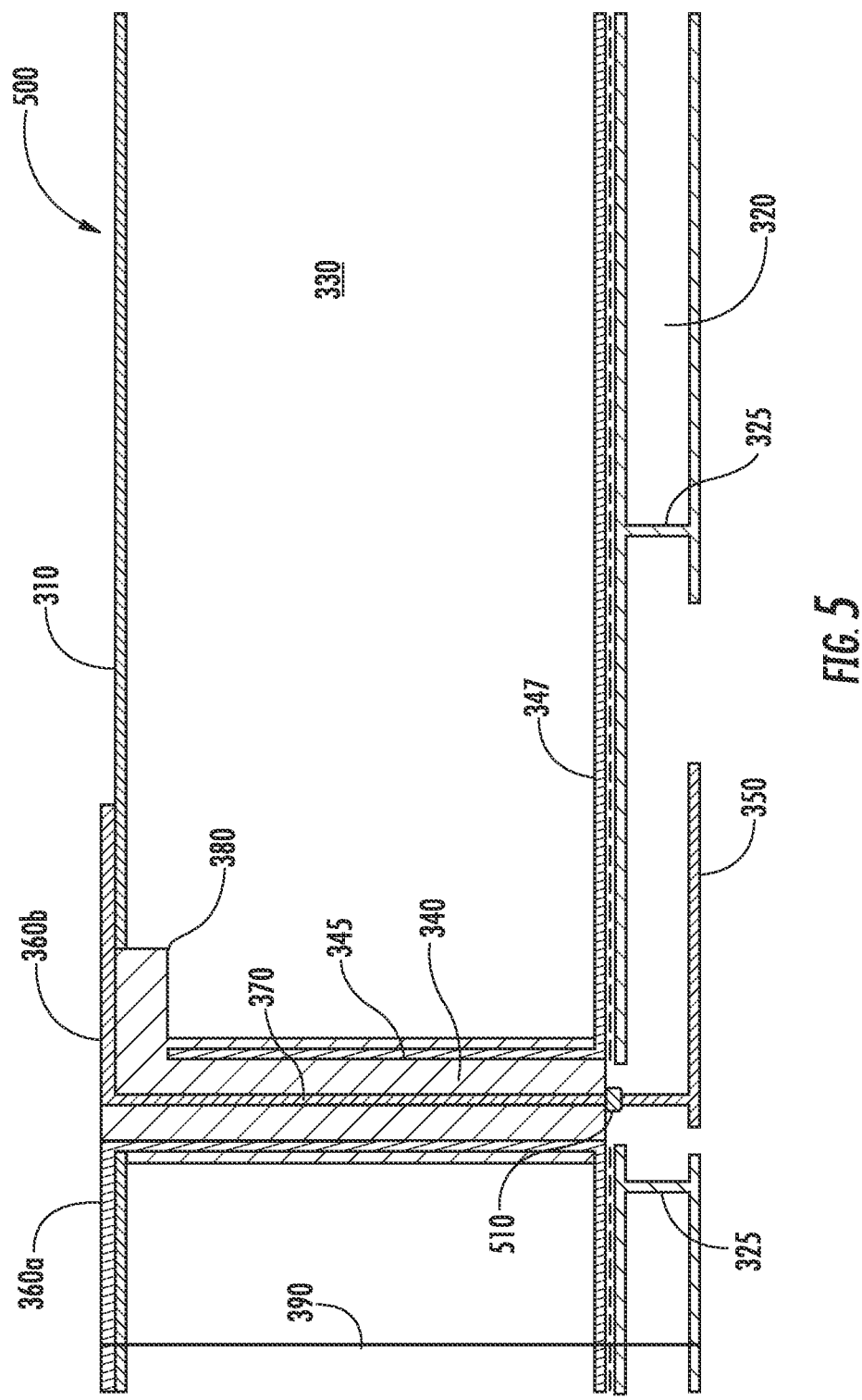
FIG. 5 shows a cross-sectional view of a third embodiment.

FIG. 5 shows a variation of the assembly shown in FIG. 3. Like components have been given identical reference designators and are not described again. In this embodiment, the bottom sublaminate 320 is attached to the foam dielectric material 330 after the central conductor 370 and the annular metal sleeve 345 have already been created. Additionally, central conductor 370 and annular metal sleeve 345 are electrically attached to the bottom sublaminate 320. Because of the difference in fabrication sequence, the signal trace 350 is electrically connected to the central conductor 370 using a conductive paste 510. This assembly differs in the use of the conductive paste 510, which may allow the use of a bottom sublaminate 320 having an arbitrary number of levels.

Figure 6:
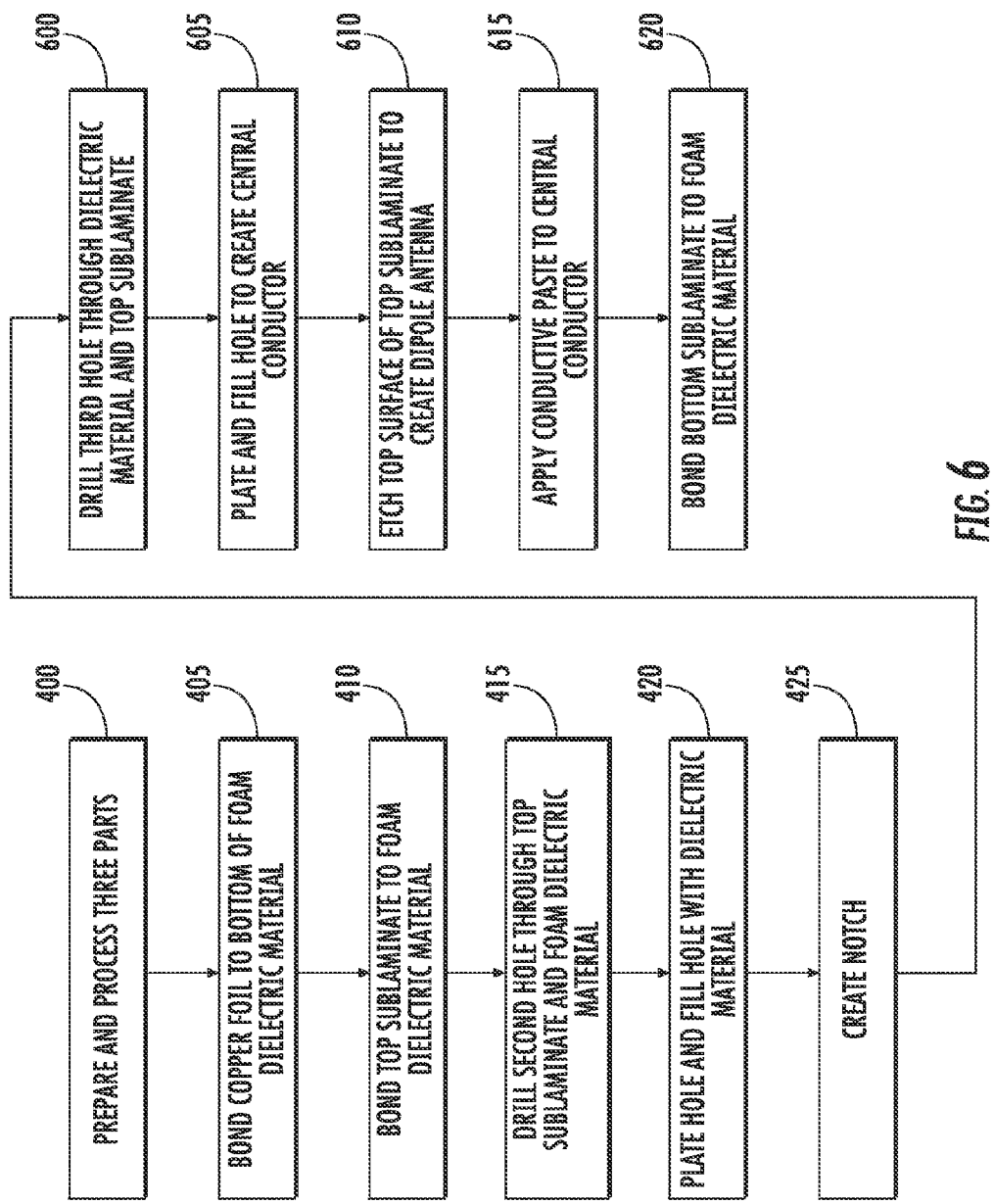
FIG. 6 is a flowchart showing a representative fabrication process used to manufacture the assembly shown in FIG. 5.

FIG. 6 shows an embodiment of a manufacturing flowchart of this assembly 500.

The fabrication of assembly 500 may begin in a similar manner as that of assembly 300. Specifically, processes 400-425 may be identical to those shown in FIG. 4. However, the fabrication of assembly 500 differs from that of assembly 300 in that the bottom sublaminate 320 is not attached until the end of the fabrication sequence. Thus, after the notch 380 has been created, in process 425, the third hole is drilled through the top sublaminate 310 and the foam dielectric material 330, as shown in process 600. The third hole is then filled and plated with a conductive material to form the central conductor 370.

The top sublaminate 310 is then etched to create the two dipoles 360*a*, 360*b*, as shown in process 610. A first dipole 360*a* is electrically connected to the annular metal sleeve 345 and the second dipole 360*b* is electrically connected to the central conductor 370. As described above, the first dipole 360*a* and the second dipole 360*b* are electrically separate from one another.

A conductive paste 510 is then applied to the central conductor 370 at the bottom of the foam dielectric material 330, as shown in process 615. The bottom sublaminate 320 is then bonded to the bottom of the foam dielectric material 330, as shown in process 620. As described above, the bonding agent may be a conductive bonding agent, so that the copper foil 347 is electrically connected to shorting vias 325 disposed on the top surface of the bottom sublaminate 320.

The conductive paste 510 serves to electrically connect the central conductor 370 to the signal trace 350. In another embodiment, the conductive paste 510 is disposed on the top surface of the bottom sublaminate 320 prior to being bonded to the bottom surface of the foam dielectric material 330.

Again, the fabrication sequence shown in FIG. 6 may be varied to achieve the assembly 500 shown in FIG. 5.

Figure 7:
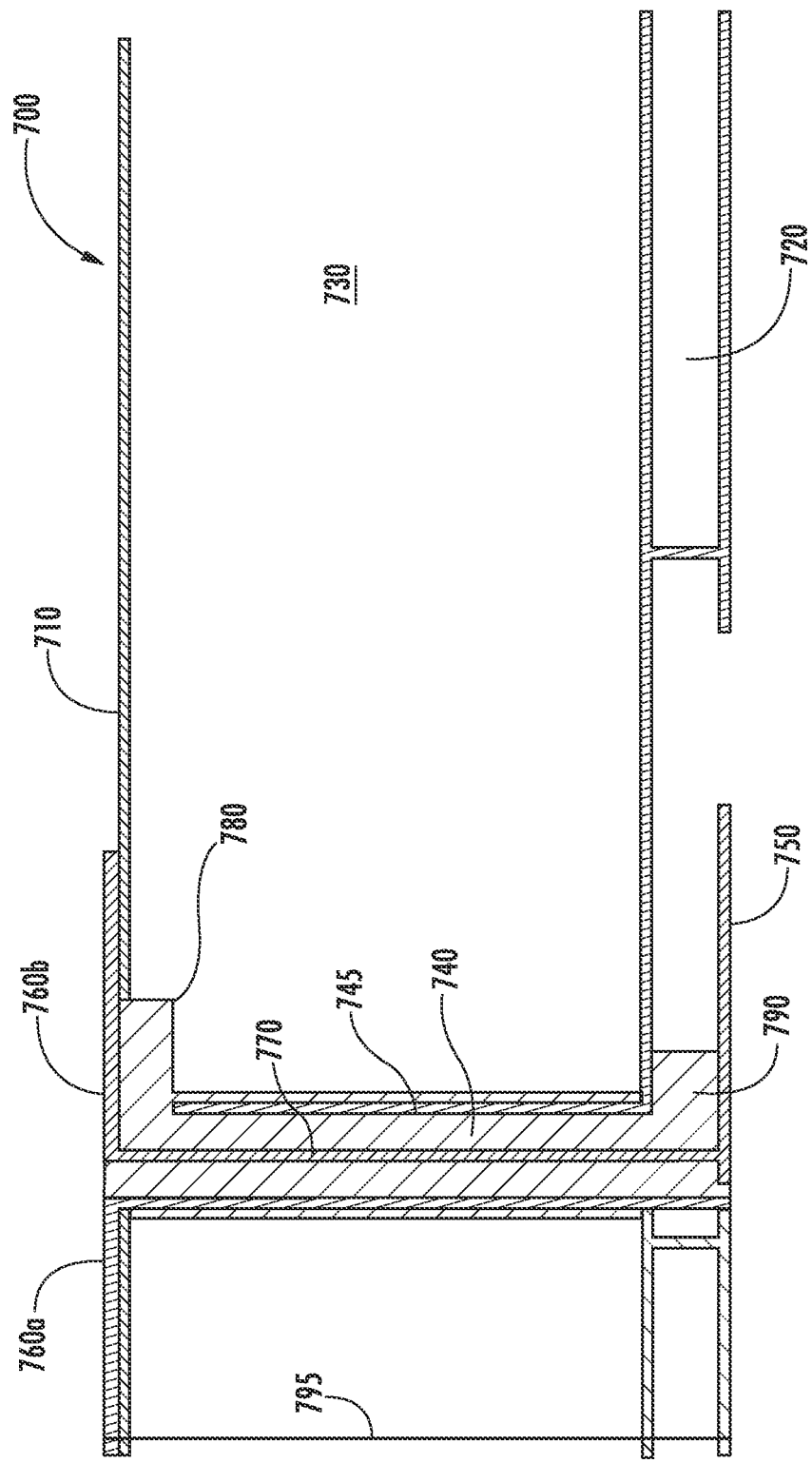
FIG. 7 shows a cross-sectional view of a fourth embodiment.
Figure 8:
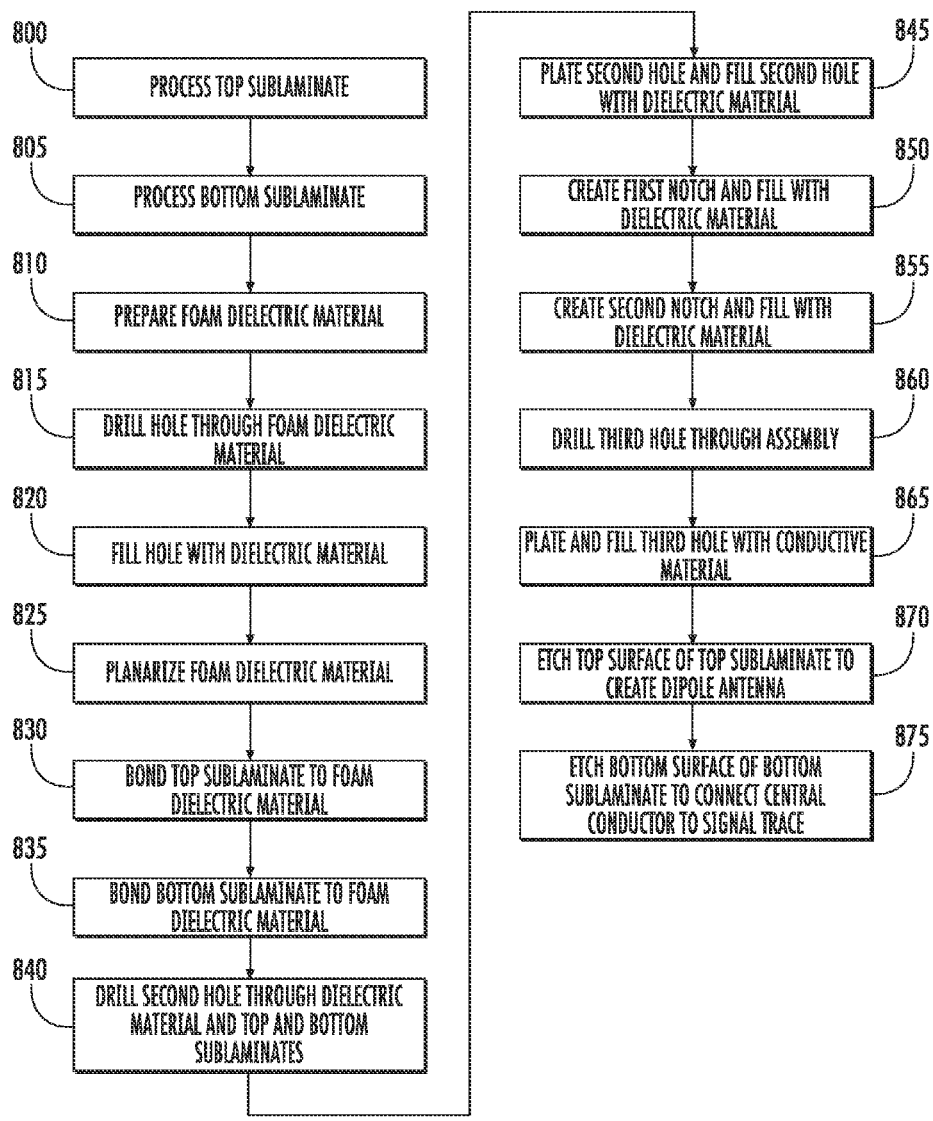
FIG. 8 is a flowchart showing a representative fabrication process used to manufacture the assembly shown in FIG. 7.

FIG. 7 shows another embodiment of an assembly 700 that includes a foam dielectric material 730 disposed between a top sublaminate 710 and a bottom sublaminate 720. The top sublaminate 710 is similar to top sublaminate 310 described above with reference to the earlier embodiments. Similarly, the bottom sublaminate 720 and the foam dielectric material 730 are similar to the bottom sublaminate 320 and the foam dielectric material 330, respectively, described above with reference to the earlier embodiments. In this embodiment, a first notch 780 is created through the top sublaminate 710 and into the top portion of the foam dielectric material 730. A second notch 790 is created through the bottom sublaminate 720 and into the bottom portion of the foam dielectric material 730. The structure of this assembly 700 may allow a simpler fabrication process, as shown in FIG. 8.

The three parts, the top sublaminate 710, the bottom sublaminate 720 and the foam dielectric material 730, are all prepared as described previously. In this embodiment, the bonding agent used to attach the foam dielectric material 730 to the top sublaminate 710 and the bottom sublaminate 720 may be non-conductive.

In this point in the fabrication sequence, the three parts are bonded to one another, and a second hole has been drilled through the entire assembly 700. An alignment hole 795 in each component may be used to ensure alignment during the bonding process. The second hole passes through the dielectric material 740 previously disposed in the foam dielectric material 730. The second hole is preferably concentric with the hole drilled through the foam dielectric material in process 815.

In process 845, this second hole is then plated with a conductive material, such that the conductive material extends from the top of the top sublaminate 710 to the bottom of the bottom sublaminate 720. This forms annular metal sleeve 745. After plating, the second hole is then filled with a dielectric material 740. One or more of the layers of bottom sublaminate 720 may be a ground layer. In certain embodiments, the ground layers in the bottom sublaminate 720 are electrically connected to the annular metal sleeve 745, thereby providing a ground path for the annular metal sleeve 745.

At this point in the fabrication sequence, the annular metal sleeve 745 has been formed and extends from the top surface of the top sublaminate 710 to the bottom surface of the bottom sublaminate 720. As a central conductor 770 still needs to be disposed within the annular metal sleeve 745, notches must be introduced to allow the central conductor 770 to be able to exit from the annular metal sleeve 745 and electrically connect to signals on the top sublaminate 710 and bottom sublaminate 720.

In process 850, a first notch 780 is formed in the top sublaminate 710. The first notch 780 is used to remove some of the plating from the portion of the annular metal sleeve 745 near the top sublaminate 710. The first notch 780 may be relatively small; its purpose is to create a path through the annular metal sleeve 745 through which a signal trace can pass on the top surface of the top sublaminate 710. The first notch 780 may extend through the entirety of the top sublaminate 710 and into a top portion of the foam dielectric material 730. After the first notch 780 is created, it is then filled with dielectric material 740. The top surface of the dielectric material 740 on the top sublaminate 710 is then plated, creating a solid metal surface on the top surface of the top sublaminate 710.

In process 855, a second notch 790 is formed in the bottom sublaminate 720. The second notch 790 is used to remove some of the plating from the portion of the annular metal sleeve 745 near the bottom sublaminate 720. Like the first notch 780, the second notch 790 may be relatively small; its purpose is to create a path through the annular metal sleeve 745 through which a signal trace can pass on the bottom surface of the bottom sublaminate 720. The second notch 790 may extend to the top ground layer of bottom sublaminate 720, stopping shy of this layer, to a controlled depth leaving minimal or no trace of the annular metal sleeve 745. After the second notch 790 is created, it is then filled with dielectric material 740. The bottom surface of the dielectric material 740 on the bottom sublaminate 720 is then plated, creating a solid metal surface on the bottom surface of the bottom sublaminate 720.

In process 860, a third hole is drilled through the assembly 700, preferably concentric with the second hole. This third hole has a smaller diameter than the second hole. This third hole extends through the entirety of the assembly 700, from the top surface of the top sublaminate 710 to the bottom surface of the bottom sublaminate 720.

This third hole is then plated and filled with a conductive material to form central conductor 770, as shown in process 865. The conductive material may be metal.

The top surface of the top sublaminate 710 is then etched to as to create two dipoles 760*a*, 760*b*, as shown in process 870. A first dipole 760*a* is in electrical communication with the annular metal sleeve 745, while the second dipole 760*b* is in electrical communication with the central conductor 770.

Finally, in process 875, the bottom surface of the bottom sublaminate 720 is etched so as to create the signal trace 750, now in electrical connection with central conductor 770 and isolated from ground. This fabrication sequence can be altered if desired. For example, the first and second notches may be created in any order.

In certain embodiment, back drilling may be used if the signal trace 750 is not located on the bottom surface of the bottom sublaminate 720.

Figure 9:
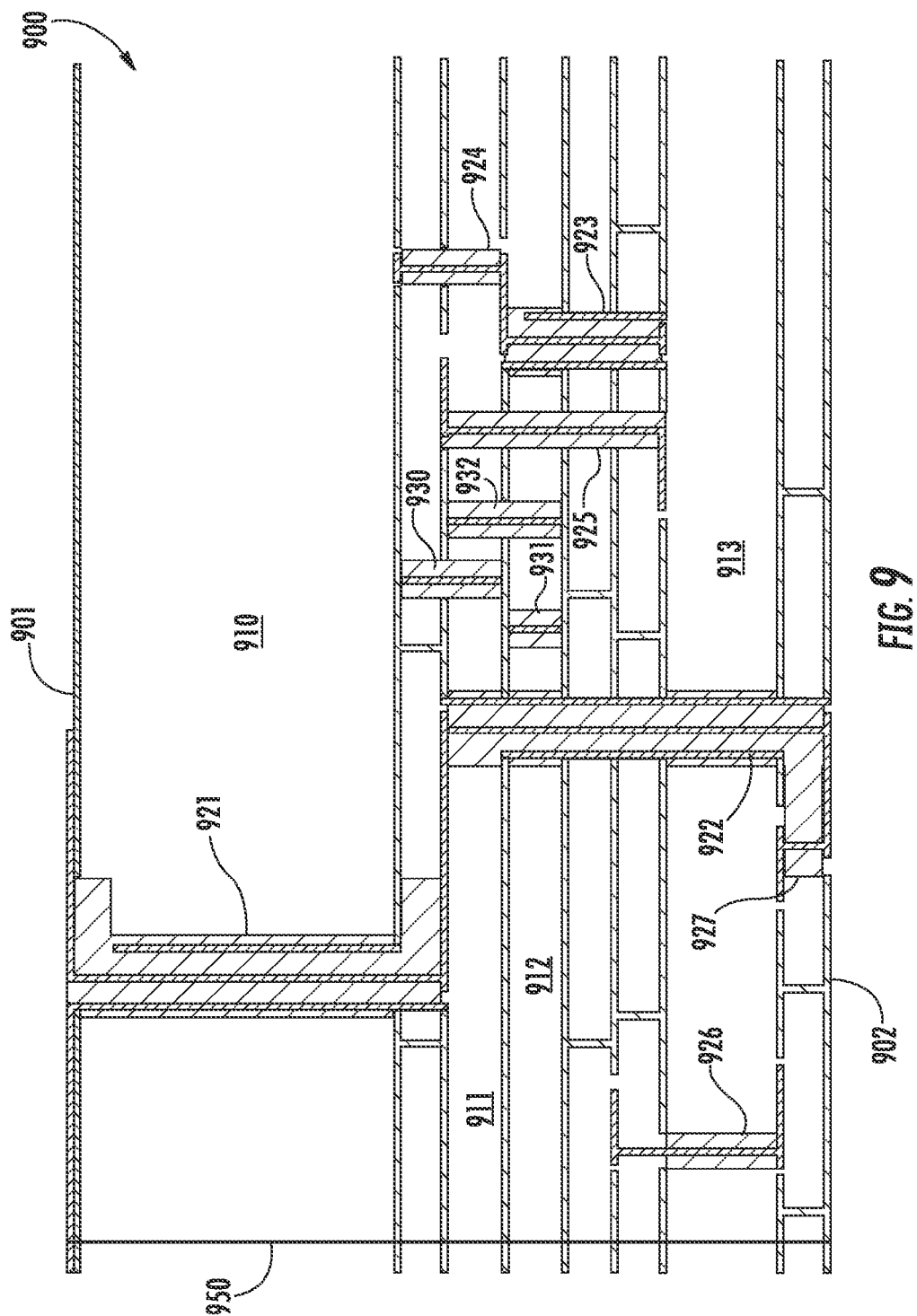
FIG. 9 shows a cross-sectional view of an embodiment of a printed circuit board with multiple foam dielectric layers.

FIG. 9 shows an embodiment of a printed circuit board 900 having a plurality of layers of foam dielectric material, as well as traditional signal and ground layers. This figure shows a variety of different connections that may be made between the various layers of the printed circuit board 900. However, this figure is purely illustrative of these connection types. It is not meant to suggest that all, or even several, of these different connection types may exist within a single PCB.

This printed circuit board 900 shows four layers of foam dielectric material, referred to as foam dielectric layers 910, 911, 912, and 913. Note that all foam dielectric layers do not need to be the same thickness. In fact, in this embodiment, the top foam dielectric layer 910 is shown as the thickest, as an antenna may be disposed on the top surface 901. In addition to four foam dielectric layers, there may be a plurality of signal and ground layers, including a top surface 901 and a bottom surface 902. These layers may be aligned through the use of an alignment hole 950, that extends through all of the layers.

Various connections are possible. These include blind vias, where the via extends to only one of the top surface 901 or the bottom surface 902, and buried vias where the via does not extend to either the top surface 901 or the bottom surface 902.

Connection 921 is a blind via, which extends to the top surface 901, but not to the bottom surface 902. This may be created using the process described in FIG. 4 or 6, where a back drilling process is also used. Connections 922 and 927 are also blind vias, which extend to the bottom surface 902. In another embodiment, a blind via may be created by drilling a hole to a certain depth prior to plating. For example, a hole may be drilled from the bottom surface 902 to the next layer of the bottom sublaminate. This hole is then plated to create the blind via 927.

Connections 925-926 are buried vias, without a coaxial sleeve, which use a central conductor to carry the signal between two different layers. To create a buried via, the foam dielectric material may be prepared as shown in processes 210-225 (see FIG. 2). The foam dielectric layer can then be bonded to a top sublaminate and a bottom sublaminate. The center conductor may be formed by drilling another hole, of smaller diameter, through the dielectric material. This smaller hole may be plated after the assembly of all of the layers is completed. A back drilling step may be performed afterwards. In another embodiment, the layers that form the buried via are first created as a sublaminate as described above. After the sublaminate and the via have been created, additional layers may be added on either side of this sublaminate. This will result in the vias being buried.

Connection 923 is a buried via that also includes a coaxial sleeve. These may be created by preparing the foam dielectric material by drilling a first hole, filling it with a dielectric material, covering each side of the foam dielectric layer with a metal foil, drilling a second hole, plating the second hole. The second hole is then filled with more of the dielectric material, such that the plating is surrounded on each side by the dielectric material. The foam dielectric layer can then be assembled as part of the PCB stack, and the center conductor may be drilled through the dielectric materials using a third hole and the third hole may be plated after the assembly of all of the layers is completed. A back drilling step may be performed afterwards. In another embodiment, the layers that form the buried via are first created as a sublaminate as described above. After the sublaminate and the via have been created, additional layers may be added on either side of this sublaminate. This will result in the vias being buried.

Connections 930-932 represent buried shorting vias, which simply short signals on two different layers together without the use of a coaxial sleeve. The foam dielectric layers through which signals pass may be prepared before assembly. For example, in any location where a via is to pass through the foam dielectric layer, a first hole may be drilled and then filled with dielectric material prior to being assembled into the PCB stack. In this way, the signal conductor holes can be drilled through the entirety of the assembled stack, plated and then back drilled to create the desired buried vias.

Thus, while some of the embodiments show a layer of foam dielectric material disposed between a top sublaminate and a bottom sublaminate, other configurations are possible. For example, the foam dielectric material may be disposed between a first sublaminate and a second sublaminate. The foam dielectric material may comprise a via, having a central conductor disposed therein and also having a dielectric material disposed between the foam dielectric material and the central conductor.

While particular embodiments of the disclosure have been shown and described, it will be obvious to those skilled in the art that various changes and modifications may be made without departing from the present disclosure in its broader aspects. It is intended that all matter contained in the above description and shown in the accompanying drawings shall be interpreted as illustrative and not in a limiting sense.

What is claimed is:

1. An assembly, comprising:
   a top sublaminate;
   a bottom sublaminate;
   a foam dielectric material disposed between the top sublaminate and the bottom sublaminate; and
   a via passing through the foam dielectric material, so as to electrically connect a first signal trace on the top sublaminate to a second signal trace on the bottom sublaminate.

2. The assembly of claim 1, wherein the first signal trace is disposed on a top surface of the top sublaminate.

3. The assembly of claim 2, wherein the first signal trace comprises an antenna.

4. The assembly of claim 1, wherein the via comprises:
   an annular metal sleeve disposed around an inner circumference of the via;
   a conductive path disposed within the annular metal sleeve connecting the first signal trace on the top sublaminate to the second signal trace disposed on the bottom sublaminate; and
   an insulating material disposed in the via between the annular metal sleeve and the conductive path.

5. The assembly of claim 4, wherein said annular metal sleeve is electrically connected to ground.

6. The assembly of claim 5, wherein said annular metal sleeve comprises a first notch, disposed near the top sublaminate, to allow the first signal trace to connect to the conductive path.

7. The assembly of claim 6, wherein said annular metal sleeve comprises a second notch, disposed near the bottom sublaminate, to allow the second signal trace to connect to the conductive path.

8. The assembly of claim 4, wherein the first signal trace is a first dipole of a dipole antenna and a second dipole is electrically connected to the annular metal sleeve.

9. The assembly of claim 1, wherein the via comprises:
   a conductive path disposed within the via connecting the first signal trace on the top sublaminate to the second signal trace disposed on the bottom sublaminate; and
   an insulating material disposed in the via between the foam dielectric material and the conductive path.

10. An assembly, comprising:
    a first sublaminate;

a second sublaminate;
a foam dielectric material disposed between the first sublaminate and the second sublaminate; and
a via passing through the foam dielectric material, so as to electrically connect a first signal trace on the first sublaminate to a second signal trace on the second sublaminate, wherein the via comprises:
  a conductive path disposed within the via connecting the first signal trace on the first sublaminate to the second signal trace disposed on the second sublaminate; and
  an insulating material disposed in the via between the foam dielectric material and the conductive path.

11. The assembly of claim 10, wherein at least one of the first sublaminate and the second sublaminate is an interior layer of a printed circuit board.

12. A method of manufacturing an assembly, comprising:
processing a top sublaminate, having a first signal trace;
processing a bottom sublaminate, having a second signal trace;
cleaning and baking a foam dielectric material;
drilling a first hole through the foam dielectric material;
filling the first hole with a dielectric material, different than the foam dielectric material;
bonding the top sublaminate to a first surface of the foam dielectric material and the bottom sublaminate to a second surface of the foam dielectric material;
drilling a second hole through the top sublaminate, the dielectric material in the foam dielectric material and the bottom sublaminate; and
plating and filling the second hole to create a central conductor to electrically connect the first signal trace and the second signal trace.

13. The method of claim 12, further comprising drilling a hole to a controlled depth through the bottom sublaminate after the plating to remove the central conductor from one or more layers of the bottom sublaminate.

14. The method of claim 12, further comprising coating the foam dielectric material so as to seal the dielectric material.

15. A method of manufacturing an assembly having a coaxial sleeve, comprising:
processing a top sublaminate, having a first signal trace;
processing a bottom sublaminate, having a second signal trace;
cleaning and baking a foam dielectric material;
drilling a first hole through the foam dielectric material;
filling and planarizing the first hole with a dielectric material, different than the foam dielectric material;
bonding the top sublaminate to a first surface of the foam dielectric material;
drilling a second hole through the dielectric material and the top sublaminate;
bonding the bottom sublaminate to a second surface of the foam dielectric material;
plating the second hole and then filling the plated second hole with dielectric material to create the coaxial sleeve;
drilling a third hole through the top sublaminate, the dielectric material in the foam dielectric material and the bottom sublaminate; and
plating and filling the third hole to create a central conductor to electrically connect the first signal trace and the second signal trace.

16. The method of claim 15, further comprising bonding a copper foil to the second surface of the foam dielectric material prior to bonding the bottom sublaminate to the foam dielectric material and drilling the second hole through the copper foil.

17. The method of claim 16, further comprising electrically connecting the coaxial sleeve to the copper foil in the bottom sublaminate.

18. The method of claim 15, further comprising creating a notch in the top sublaminate and a portion of the foam dielectric material, filling the notch with dielectric material, and plating a top surface of the top sublaminate.

19. The method of claim 18, further comprising creating a second notch in the bottom sublaminate and a portion of the foam dielectric material, filling the notch with dielectric material, and plating a bottom surface of the bottom sublaminate.

20. The method of claim 15, further comprising coating the foam dielectric material so as to seal the dielectric material.

21. The method of claim 15, further comprising bonding the bottom sublaminate to the foam dielectric material prior to drilling the second hole and drilling the second hole through the bottom sublaminate.

22. A method of manufacturing an assembly having a coaxial sleeve, comprising:
processing a top sublaminate, having a first signal trace;
processing a bottom sublaminate, having a second signal trace;
cleaning and baking a foam dielectric material;
drilling a first hole through the foam dielectric material;
filling and planarizing the first hole with a dielectric material, different than the foam dielectric material;
bonding the top sublaminate to a first surface of the foam dielectric material;
drilling a second hole through the dielectric material and the top sublaminate;
plating the second hole and then filling the plated second hole with dielectric material to create the coaxial sleeve;
drilling a third hole through the top sublaminate and the dielectric material in the foam dielectric material;
plating and filling the third hole to create a central conductor used to electrically connect the first signal trace and the second signal trace;
applying conductive paste to the central conductor on the second surface of the foam dielectric material; and
bonding the bottom sublaminate to the second surface of the foam dielectric material, wherein the conductive paste electrically connects the central conductor to the second signal trace.

23. The method of claim 22, further comprising bonding copper foil to a second surface of the foam dielectric material prior to bonding the bottom sublaminate.

24. The method of claim 22, further comprising creating a notch in the top sublaminate and a portion of the foam dielectric material, filling the notch with dielectric material, and plating a top surface of the top sublaminate.

* * * * *